(12) United States Patent
Jeter et al.

(10) Patent No.: US 11,501,820 B2
(45) Date of Patent: Nov. 15, 2022

(54) SELECTIVE REFERENCE VOLTAGE CALIBRATION IN MEMORY SUBSYSTEM

(71) Applicant: Apple Inc., Cupertino, CA (US)

(72) Inventors: Robert E. Jeter, Santa Clara, CA (US); Kai Lun Hsiung, Fremont, CA (US); Rakesh L. Notani, Santa Clara, CA (US); Venkata Ramana Malladi, Santa Clara, CA (US); John H. Kelm, Belmont, CA (US); Taehyun Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/181,979

(22) Filed: Feb. 22, 2021

(65) Prior Publication Data

US 2022/0270664 A1 Aug. 25, 2022

(51) Int. Cl.
*G11C 11/00* (2006.01)
*G11C 11/4074* (2006.01)
(Continued)

(52) U.S. Cl.
CPC ........ *G11C 11/4074* (2013.01); *G06F 3/0604* (2013.01); *G06F 3/0629* (2013.01);
(Continued)

(58) Field of Classification Search
CPC .............. G11C 16/3459; G11C 11/406; G11C 11/40611; G11C 11/4076; G11C 11/4093; G11C 11/4096; G11C 2207/2218; G11C 2207/2254; G11C 29/023; G11C 29/028; G11C 7/1006; G11C 7/12; G11C 7/22; G11C 8/12; G11C 8/18; G11C 16/3418; G11C 29/025; G11C 29/52; G11C 11/409; G11C 11/5628; G11C 11/5642;
(Continued)

(56) References Cited

U.S. PATENT DOCUMENTS 9,899,067 B2 2/2018 Bialas, Jr. et al.
10,991,403 B2 * 4/2021 Jeter .................... G11C 29/028
(Continued)

FOREIGN PATENT DOCUMENTS

WO 2020/081539 A1 4/2020

*Primary Examiner* — Thong Q Le
(74) *Attorney, Agent, or Firm* — Kowert, Hood, Munyon, Rankin & Goetzel, P.C.; Erik A. Heter; Dean M. Munyon

(57) ABSTRACT

A method and apparatus for selective reference voltage calibration in a memory subsystem is disclosed. A memory subsystem includes a memory coupled to a memory controller. The memory controller may operate in one of a number of different performance states. The memory controller further includes a calibration circuit configured to perform reference voltage calibrations for the various ones of the performance states to determine corresponding reference voltages. For a performance state change from an initial performance state to a final performance state, via an intermediate performance state, the memory controller is configured to transition to the intermediate performance state without causing the calibration circuit to perform a reference voltage calibration in that state. Thereafter, the memory controller transitions to the final performance state.

20 Claims, 8 Drawing Sheets

(51) Int. Cl.
    *G11C 11/4096*    (2006.01)
    *G06F 3/06*        (2006.01)
    *G11C 11/4076*    (2006.01)

(52) U.S. Cl.
    CPC ........ *G06F 3/0673* (2013.01); *G11C 11/4076* (2013.01); *G11C 11/4096* (2013.01)

(58) Field of Classification Search
    CPC . G11C 11/5671; G11C 16/0483; G11C 16/10; G11C 16/26; G11C 16/3427; G11C 16/3454; G11C 2211/5621; G11C 29/50012; G11C 29/56012; G11C 7/10; G11C 7/222; G11C 16/34; G11C 29/02; G09G 2310/062; G09G 3/344; G09G 2310/06; G09G 2310/063; G09G 2310/068; G09G 2320/0204; G09G 2320/0209; G09G 2320/0257; G09G 2230/00; G09G 2310/04; G09G 2310/065; G09G 2310/08; G09G 2320/0252; G09G 2320/041; G09G 2340/0435
    USPC .... 711/167, 106, 105, E12.001; 702/182, 77
    See application file for complete search history.

(56) References Cited

U.S. PATENT DOCUMENTS

2020/0090764 A1    3/2020    Ito
2020/0265881 A1*    8/2020    Jeter .................... G11C 29/028

* cited by examiner

US 11,501,820 B2

SELECTIVE REFERENCE VOLTAGE CALIBRATION IN MEMORY SUBSYSTEM

BACKGROUND

Technical Field

This disclosure is directed to memory subsystems, and more particularly, calibrations performed in memory subsystems.

Description of the Related Art

Eye patterns, or eye diagrams, are graphic illustrations that illustrate times and amplitudes at which a digital signal can be sampled at its correct value. In various types of systems that include data transmissions, it is desirable to sample signals (e.g., data signals synchronized by a clock signal) near a center of an eye, in terms of time and sampling voltage. In terms of timing, this can provide a signal with a sufficient amount of both setup and hold time, while also rendering it less susceptible to noise. In terms of voltage, this can enable a more accurate determination of a logic value (e.g., logic one or logic zero) based on a reference voltage used to distinguish one from the other.

In memory subsystems, calibrations may be performed to determine the points at which signals are sampled within the eye pattern. Calibrations are performed to determine an eye diagram that enables accurate sampling of signals, and thus include calibrations based both on the timing (sometimes referred to as a horizontal calibration) and sampling reference voltage (sometimes referred to as a vertical calibration). Performing these calibrations typically includes adjusting a number of different parameters that govern transmission of data between a memory controller and a memory. These parameters include a delay applied to a data strobe signal during the horizontal calibrations. A vertical calibration may include a number of horizontal calibrations performed at different reference voltages. Such calibrations may be performed during a system startup, and may also be performed on a periodic basis thereafter. Calibrations may also be performed in response to changes of a performance state.

SUMMARY

A method and apparatus for selective reference voltage calibration in a memory subsystem is disclosed. In one embodiment, a memory is coupled to a memory controller. The memory controller may operate in one of a number of different performance states. The memory controller further includes a calibration circuit configured to perform reference voltage calibrations for the various ones of the performance states to determine corresponding reference voltages. For a performance state change from an initial performance state to a final performance state, via an intermediate performance state, the memory controller is configured to transition to the intermediate performance state without causing the calibration circuit to perform a reference voltage calibration in that state. Thereafter, the memory controller transitions to the final performance state.

In one embodiment, a reference voltage calibration may be performed upon entry into the final performance state. The reference voltage calibration may be performed to determine a reference voltage used to distinguish logic values from one another in data written to or read from the memory. A reference voltage calibration in various embodiments includes determining a width of an eye pattern at one or more reference voltages, and selecting the reference voltage at which the eye pattern is at its widest.

In various embodiments, a reference voltage calibration may be dynamic in terms of the number of different reference voltages at which the calibration is conducted. A reference voltage calibration may begin with determining the width of the eye pattern at the previously calibrated reference voltage value. If the width of the eye pattern at the previously calibrated reference voltage is greater than or equal to that obtained during the previous calibration, the calibration may be terminated, with the previous reference voltage used as the currently calibrated reference voltage. Otherwise, adjustments may be made to determine the reference voltage having the largest eye pattern width.

BRIEF DESCRIPTION OF THE DRAWINGS

The following detailed description makes reference to the accompanying drawings, which are now briefly described.

DETAILED DESCRIPTION OF EMBODIMENTS

Figure 1:
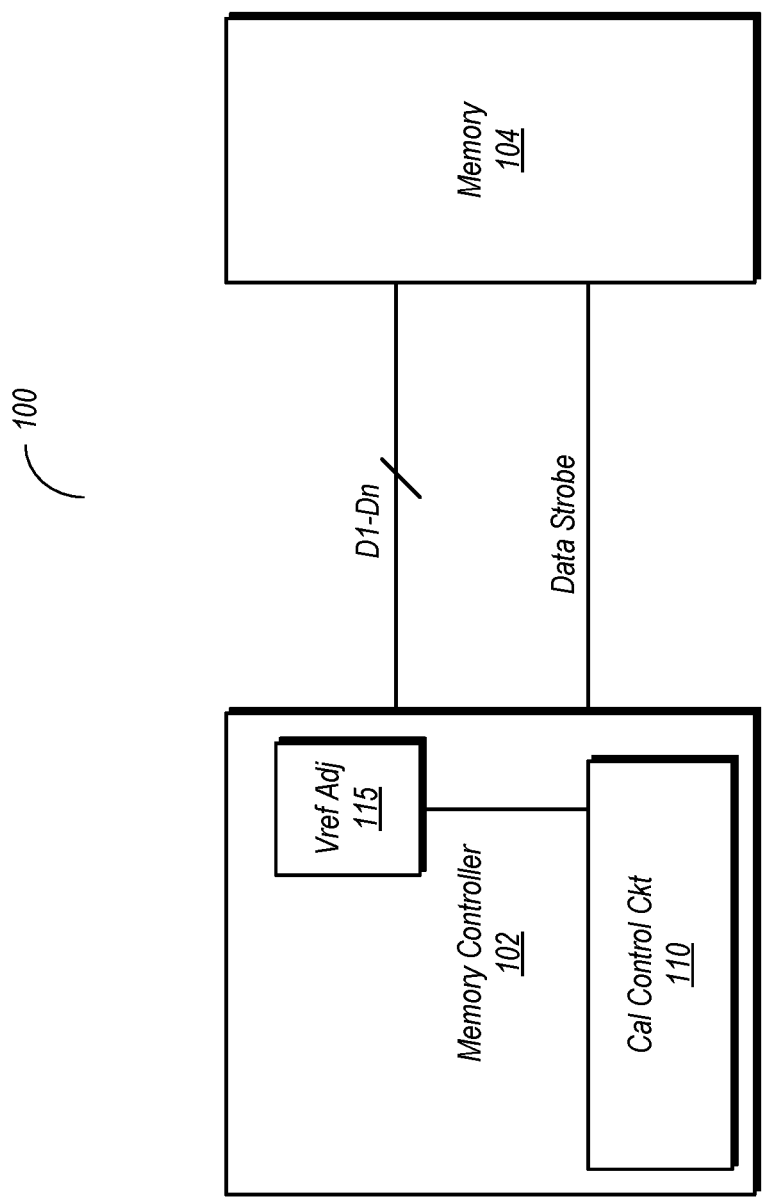
FIG. 1 is a block diagram of one embodiment of a memory subsystem.

Like many other components in a computer system, a memory subsystem (including a memory and a memory controller) may operate in different performance states. As used herein, a performance state may be defined by an operating clock frequency, with different performance states operating using different clock frequencies. In some embodiments, a performance state may additionally be defined by an operating voltage, with the operating voltages for some states being different than for others.

Performance states may be selected during operation based on current operating conditions. For example, for higher performance demands, a performance state with a higher clock frequency may be selected. For conditions in which performance demand is lower, power savings may be prioritized, and thus a performance state having a lower clock frequency may be selected. Performance states that balance these priorities may also be implemented.

In order to ensure correct operation, memory subsystems may undergo calibrations to ensure sufficient timing and voltage margins in the reading and writing of data. Accordingly, two types of calibrations may be performed. A first type of calibration may be performed with regard to the timing of a data strobe signal that is used to synchronize data transfers between the memory and a memory controller. This type of calibration may be referred to as a horizontal calibration. During a horizontal calibration data may be read from the memory and compared to expected data for different amounts of delay that are applied to the data strobe signal, with a delay value selected at a point where no read errors are detected. A horizontal calibration may be conducted at a particular reference voltage.

A second type of calibration determines a reference voltage at which data it to be read during subsequent operations. A reference voltage is a voltage used to distinguish between a logic zero and a logic one when reading data. This type of calibration may be referred to as a reference voltage calibration, or alternatively, a vertical calibration. A vertical calibration may include a number of horizontal calibrations that are conducted at different values of a reference voltage. Based on the vertical calibration, a reference voltage may be selected.

Horizontal and vertical calibrations may be used to determine what is known as an eye pattern (or eye diagram, or simply, "eye"). An eye pattern may be graphically represented by a range of voltages and timing values at which data may be correctly read from memory. Moving away from the center of the eye, the timing margins may decrease as the distance of the reference voltage from the center of the eye increases. Similarly, the voltage margins may decrease as the distance from the center increases. The selection of the reference voltage in a vertical calibration may be based on selecting the voltage at which the eye was at its widest, as this point may provide the largest voltage and timing margins.

In memory subsystems that operate in different performance states, the timing and voltage margins may vary from one performance state to another. Accordingly, calibrations may be performed for each of the various performance states. In some memory subsystems having a number of performance states (e.g., six different performance states defined by six different clock frequencies), moving directly from one state to another state may be prohibited. Instead, such memory subsystems may be designed such that for transfers between at least some performance states, a transfer from an initial performance state to a final performance state may include a transfer to an intermediate performance state.

In many memory subsystems, entry into a performance state results in a reference voltage (vertical) calibration being performed. However, a full reference voltage calibration can consume a significant amount of time, and may thus impact the performance of the memory subsystem and the larger computer system in which it is implemented. The present disclosure makes use of the insight that there may be some performance states that, when utilized as an intermediate performance state, may be safe to enter and temporarily operate using a previously calibrated value of a reference voltage (which may be referred to as a "stale" reference voltage). Accordingly, the present disclosure contemplates a memory subsystem in which transitions are performed between an initial and a final performance state, through an intermediate performance state, in which normal memory operations begin without performing a calibration in the intermediate performance state.

For the purposes of this disclosure, an initial performance state may be defined as a performance state in which the memory subsystem was operating prior to a transition between performance states. A final performance state may be defined as a performance state in which the memory subsystem operates after the desired transition is complete. An intermediate performance state may be defined as a performance state that is temporarily entered after leaving the initial performance state and prior to entering the final performance state. It is noted that in this context, "final" is a relative term with respect to "initial" and "intermediate" for a particular transition between performance states. That is, "final performance state" is not intended to suggest that further performance state transitions are precluded. Rather, a "final performance state" with respect to one transition could be an "initial performance state" with respect to a different transition. Furthermore, for the purposes of this disclosure, having a memory subsystem available for "normal" memory operations may be defined herein as a state in which requests from agents outside of the memory subsystem are processed. For example, during normal operations as defined herein, an agent external to the memory subsystem may request data that is stored in memory, with the data being read and provided as a result of the request. For the purposes of this disclosure, stating that memory traffic is "blocked" may be defined as a state in which the memory subsystem does not accept requests from outside of the memory subsystem, although there may be some data transfers between the memory and memory controller, such as during a calibration. For example, if an agent outside of the memory subsystem submits a request thereto when memory traffic is blocked, that request may be either denied or delayed until such time that traffic is no longer blocked.

The present disclosure also contemplates a dynamic reference voltage calibration. The dynamic reference voltage calibration may, in at least some instances, be performed using fewer than the total number of reference voltage points used for a full reference voltage calibration.

In some cases, the reference voltage calibration may be performed at only a single reference voltage, effectively reducing a vertical calibration to a single horizontal calibration. As will be explained below, the dynamic reference voltage calibration discussed herein makes use of the insight that if the eye narrows when adjusting the reference voltage in a certain direction, it is unlikely to become wider with continued adjustments in that direction. Accordingly, a narrowing eye can be utilized as a condition to terminate calibrations that include adjustments of the reference voltage in a particular direction. The dynamic reference voltage calibration disclosed herein further contemplates terminating the calibration if the eye is found to be as wide or wider at the previously calibrated reference voltage value that is used as a starting point. This makes us of the insight that the eye being as wide or wider means that timing and voltage margins have not degraded since the last calibration and may in fact have improved.

While the calibration methodology as it pertains to performance state changes and the dynamic reference voltage calibration methodology may be performed separately from one another, the present disclosure also contemplates these two methods being performed together. This may have a synergistic effect of reducing the amount of time a memory subsystem is unavailable during transitions between performance states.

Various embodiments of the disclosed subject matter will now be described in further detail. The discussion begins with various embodiments of a memory subsystem that may be implemented in a computer. A discussion of various performance states and the possible transitions there between for one embodiment of a memory subsystem follows. An examination of an eye pattern in the context of one embodiment of a dynamic reference voltage calibration is then provided. Discussions of methods for operating the memory subsystem of the present disclosure and the calibrations performed therein follow, and thereafter an example system is disclosed.

Memory Subsystem Embodiments:

FIG. 1 is a simplified block diagram of one embodiment of a memory subsystem. In the embodiment shown, memory system 100 includes a memory controller 102 coupled to a memory 104. Memory controller 102 is coupled to memory 104 by a number of data lines D1-Dn, which may be bidirectional lines for transferring data between these two components. Embodiments with data lines dedicated to a single direction (e.g. one set for transfer to memory 104, another set for transfer from memory 104) are also possible and contemplated. Memory 104 in the embodiment shown may be a dynamic random access memory (DRAM), although the disclosure is not limited to this type of memory.

Memory controller 102 in the embodiment shown may operate in various ones of a number of different performance states. Although not explicitly shown here, memory controller 102 may receive a clock signal, the frequency of which may be variable. Accordingly, the different performance states may be defined by the frequency of the clock signal, which may be different from one performance state to the next. Performance states having a higher clock frequency may be used to obtain higher performance. Those performance states having lower clock frequencies may be used to conserve power. Performance states between the extremes of the highest and lowest clock frequencies may be used to trade off some performance for some power savings, and vice versa. While the performance states of this disclosure are discussed in terms of clock frequencies, it is noted that performance states may also be defined by an operating voltage (e.g., a supply voltage provided to various components of the memory subsystem). Thus, a performance state may generally be defined as some combination of a clock frequency and an operating voltage, with ones of the different performance states having a unique combination with respect to one another.

For one embodiment, consider performance states to be labeled as P0 to P5, with respective, different clock frequencies of F0 to F5, with F0 the lowest frequency and F5 the highest. Various performance states may be considered to be adjacent to one another. For example, performance state P0, with a clock frequency of F0, may be adjacent to P1 with a frequency of F1. Similarly, performance state P2 may be adjacent to both performance states P1 and P3. In the embodiment shown, transitioning between performance states may be limited. For example, in one embodiment, a transition from an initial performance state of P1 to a final performance state of P5 includes a transition to an intermediate performance state P3. That is, the transition is from P1 to P3 and then from P3 to P5.

Memory controller 102 in the embodiment shown includes a calibration control circuit 110 and a reference voltage adjustment circuit 115. The calibration control circuit 110 may carry out various types of calibrations that may be used to determine an eye pattern corresponding to timing and reference voltage values at which data may be validly read from memory. During certain ones of these calibrations, data may be read from memory and compared to expected data. Such calibrations may also include writing data to memory. During the calibrations, calibration control circuit 110 may cause reference voltage adjustment circuit 115 to adjust a reference voltage at which logic values may be distinguished between a logic zero and a logic one. Calibration control circuit 110 may also determine and set a calibrated value of the reference voltage, via reference voltage adjustment circuit 115, that is used in subsequent operation of memory subsystem 100.

Calibrations performed by calibration control circuit 110 may include the horizontal and vertical calibrations described above. At the beginning of system operation (e.g., upon power up and/or reboot), calibrations may be performed in each of the different performance states to determine a corresponding eye diagram. For at least some performance states, calibrations may be performed periodically when operating therein. Furthermore, for at least some performance states and/or at certain times, calibrations may be performed upon entry into that particular state.

In the embodiment shown, calibration control circuit 110 may selectively determine when to perform some calibrations. More particularly, during a transition between an initial performance state and a final performance state that also includes transitions to/from an intermediate performance state, calibration control circuit 110 may forego a calibration upon entry in the intermediate performance state. For example, during a transition from an initial performance state P1 to final performance state P5, the memory subsystem may first transition to an intermediate performance state P3. Normal operation may begin in performance state P3, without first performing a reference voltage calibration and instead using a previously calibrated reference voltage value. At some point during operation in the intermediate performance state, a segmented reference voltage calibration may be performed in which segments or portions of the calibration (in which memory traffic is blocked) are alternated with periods in which normal operations are conducted with traffic not being blocked. The segmented reference voltage calibration may be performed using certain input/output (I/O) settings that are used in the final performance state. These settings may include drive strength, impedance, and more generally, any adjustable parameter that affects signal integrity of signals transferred between the memory and memory subsystem. Upon completing the segmented reference voltage calibration, the transition to the final performance state P5 may be performed, and operation in that state may begin without first performing a reference voltage calibration. Thus, instead of performing two calibrations for two performance state transitions (P1 to P3, and P3 to P5), only a single calibration is performed, and normal operations may begin upon entry into P5. This may result in significant savings with regard to the amount of time the memory subsystem is unavailable for normal operations. In some previous memory subsystems, full reference voltage calibrations are performed whenever a new performance state is entered, which can increase the time the memory subsystem unavailable to handle requests from external agents. Therefore, reducing the number of calibrations to one may result in overall greater availability of the memory subsystem. Performing the reference voltage calibration in segments may prevent the memory subsystem from being unavailable for a continuous time that exceeds latency requirements for, e.g., real time transactions. Performing the reference voltage calibration using the I/O settings of the final performance state may allow an early commencing of normal operations upon entry into that state.

It is noted that the operation described above may be performed going from a lower initial performance state to a higher final performance state, or going from a higher initial performance state to a lower final performance state.

Calibration control circuit 110 may also perform dynamic calibrations of the reference voltage for calibrations subsequent to an initial calibration. In one embodiment, a dynamic calibration begins with a horizontal (data strobe)

calibration at the most recently calibrated value of the reference voltage. If the eye is the same width or wider at the most recently calibrated value of the reference voltage, the calibration may be terminated since the margins may be concluded to be at least as large (if not larger) as previously calibrated. If on the other hand, the eye is narrower at the most recently calibrated value of the reference voltage, the reference voltage may be adjusted in a particular direction (e.g., incremented to a higher value) and another horizontal calibration is performed. If the eye has narrowed at the adjusted reference voltage value, further adjustments in that direction are discontinued. If the eye is wider at the adjusted reference voltage, at least one additional adjustment is made with another horizontal calibration being performed. Adjustments may continue in a particular direction until the eye narrows, and the reference voltage having the widest eye is selected as the newly calibrated value.

If, after a first adjustment in a first direction, the eye at the adjusted reference voltage is narrower than the most recently calibrated value, the next adjustment is made in a second, opposite direction, e.g., decrementing the reference voltage (from the most recently calibrated value). If the eye is narrower at this reference voltage adjusted in the second direction, the previous value may again be selected as the newly calibrated value. Otherwise, the process described previously continues in that direction for one or more additional adjustments, with the reference voltage corresponding to the widest eye being selected as the newly calibrated value.

The calibration methodologies described above may be used in some embodiments synergistically. For example, a transition from P1 to P5, through P3, a dynamic reference voltage calibration using the I/O settings (e.g., drive strength) of P5 may be performed, in segments as described above. However, using the methodology of the dynamic calibration discussed herein, the calibration may be completed in fewer segments if a horizontal calibrations are conducted at fewer reference voltage values. This may eliminate the extra calibration that would otherwise be performed and may reduce the number of reference voltages at which calibrations are performed for the I/O settings P5. It is noted however that these calibration methodologies may be used separately from one another. For example, in some performance states, periodic reference voltage calibrations may be performed, and the present disclosure contemplates that the dynamic reference voltage calibration methodology may be used instead of unconditionally performing a full reference voltage calibration.

Figure 2:
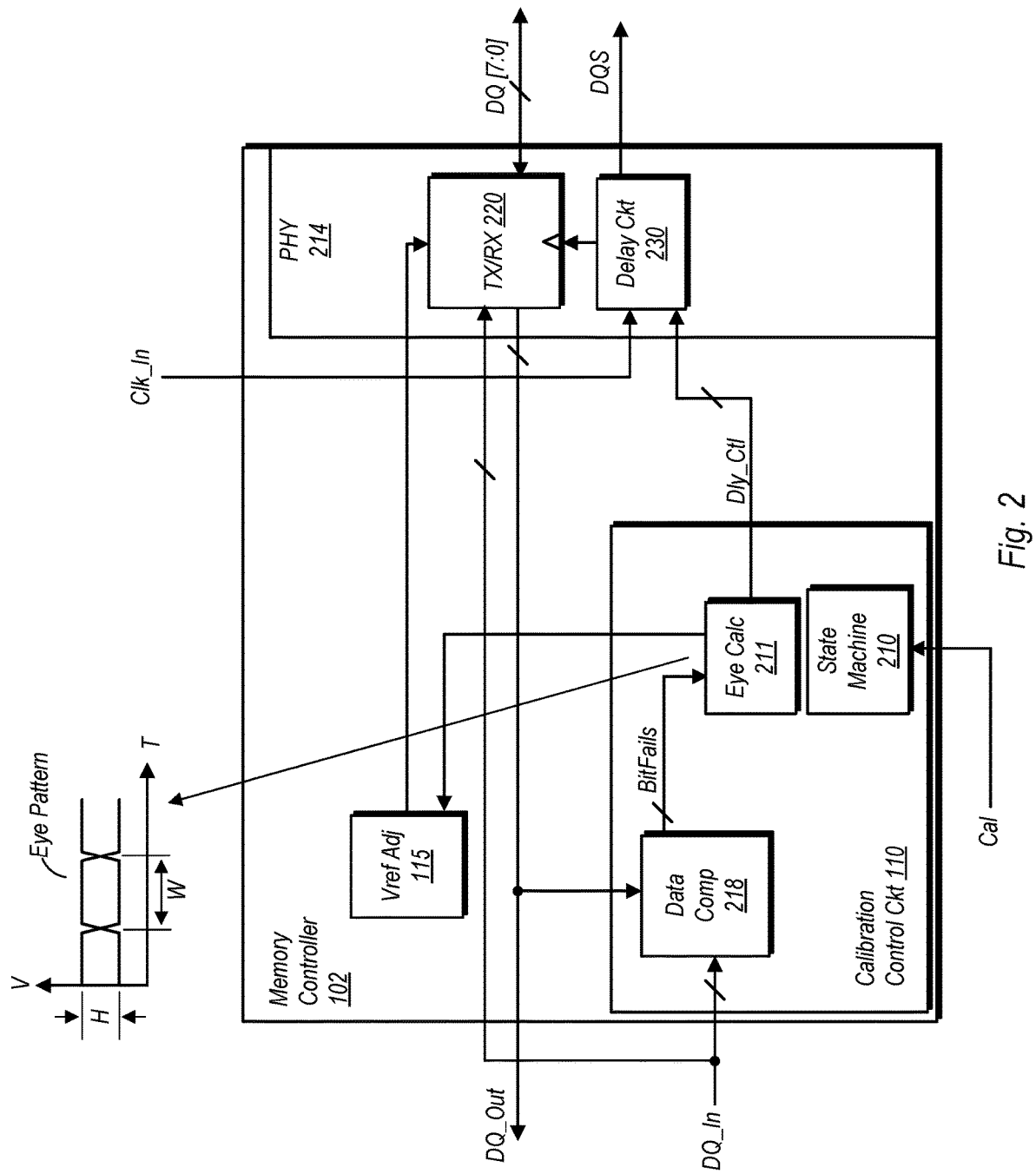
FIG. 2 is a block diagram illustrating additional details of one embodiment of a memory subsystem.

FIG. 2 is a block diagram illustrating one embodiment of a memory controller. In the embodiment shown, memory controller 102 includes a calibration control circuit 110 and a physical interface 214. Calibration control circuit 110 in the embodiment shown implements various circuit units, including data comparator 218, eye calculator 211, and a state machine 210. Physical interface 214 implements circuitry for communicating with a memory (not shown here). The circuitry of physical interface 214 includes transceiver 220 and a delay circuit 230. Data to be written to memory may be received by memory controller via the DQ_In input. Data read from memory may be conveyed to a requestor via the DQ_Out output.

In the embodiment shown, transceiver 220 of physical interface 214 is coupled to a data bus which includes data signal paths DQ[7:0]. Additionally, physical interface 214 includes a delay circuit from which a data strobe signal, DQS, is generated and conveyed to the memory in order to synchronize transfers of data. Other signal paths may be present, and the data bus shown here may be implemented with a different number of bits in other embodiments. Physical interface 214 may also include circuitry (not shown for simplicity) for adjusting various I/O settings associated with the transmission of signals to and reception of signals from memory. This may include circuitry for adjusting the drive strength of signals, controlling the impedances and/or termination of signal lines, and so on.

It is noted that in other embodiments, additional signal paths may be coupled to physical interface 214. These signal paths may include write enable signals, read enable signals, address signals, and so on. Similarly, physical interface 214 may include circuitry for generating these signals, and may include additional circuits for receiving signals. These additional signal paths and circuits are omitted here for the sake of simplicity, although there absence in the drawing is not intended to limit the disclosure in any way.

During read operations, transceiver 220 may receive signals conveyed from the memory via the signal paths DQ[7:0]. Transceiver 220 may also interpret the received signals using the reference voltage value receives from reference voltage adjustment circuit 115. More particularly, using the indicated reference voltage, transceiver 220 may determine whether individual ones of the received data signals are to be interpreted as a logic zero or a logic one. During normal operations, the output of transceiver 220, when operating to receive data from memory, is the DQ_Out output, with the data being conveyed to other units.

Delay circuit 230 in the embodiment shown is coupled to receive an input clock signal, Clk_In, provided from a source external to memory controller 102. Although not explicitly shown, delay circuit 230 may include one or more delay locked loops (DLLs) or other type of delay circuitry. Delay may be applied to the input clock signal to generate a data strobe signal, DQS, which is used to synchronize the transfer of other signals (e.g., DQ[7:0]) between a memory and memory controller 102. The amount of delay applied may be based on a delay control signal, Dly_Ctl, provided by eye calculator 211 in calibration control circuit 311. In addition to conveying the data strobe signal to the memory, delay circuit 230 in the embodiment shown is also coupled to provide a clock signal to transceiver 220.

Calibration operations may include varying the reference voltage and an amount of delay applied to the data strobe signal. Horizontal calibrations may include varying the delay over a number of different values at a particular reference voltage. A vertical calibration may include performing a number of horizontal calibrations at different reference voltage values. At each combination of a delay value and reference voltage value, data may be read from memory and compared to expected values by data comparator 218 in order to determine if any bit fails occur. A bit fail may be defined herein as a bit corresponding to a signal conveyed on a particular signal path of the data bus not matching its expected value (e.g., read as a logic zero when a logic one is expected). In some embodiments, the data that is compared may be received by data comparator 218 via the DQ_In input, and thus the corresponding calibration operations may include the writing this data to memory.

Bit fails may be reported to eye calculation circuit 211. Responsive to receiving information of a bit fail, eye calculation circuit 211 may record the failing bit along with the reference voltage value and the delay value. Based on the data from failing bits and corresponding reference voltage and delay values, eye calculation circuit 211 may calculate an eye pattern. In some embodiments, an eye pattern may be calculated for each bit position individually, with the eye being calculated based on, e.g., an average of the individual signal paths.

Figure 5:
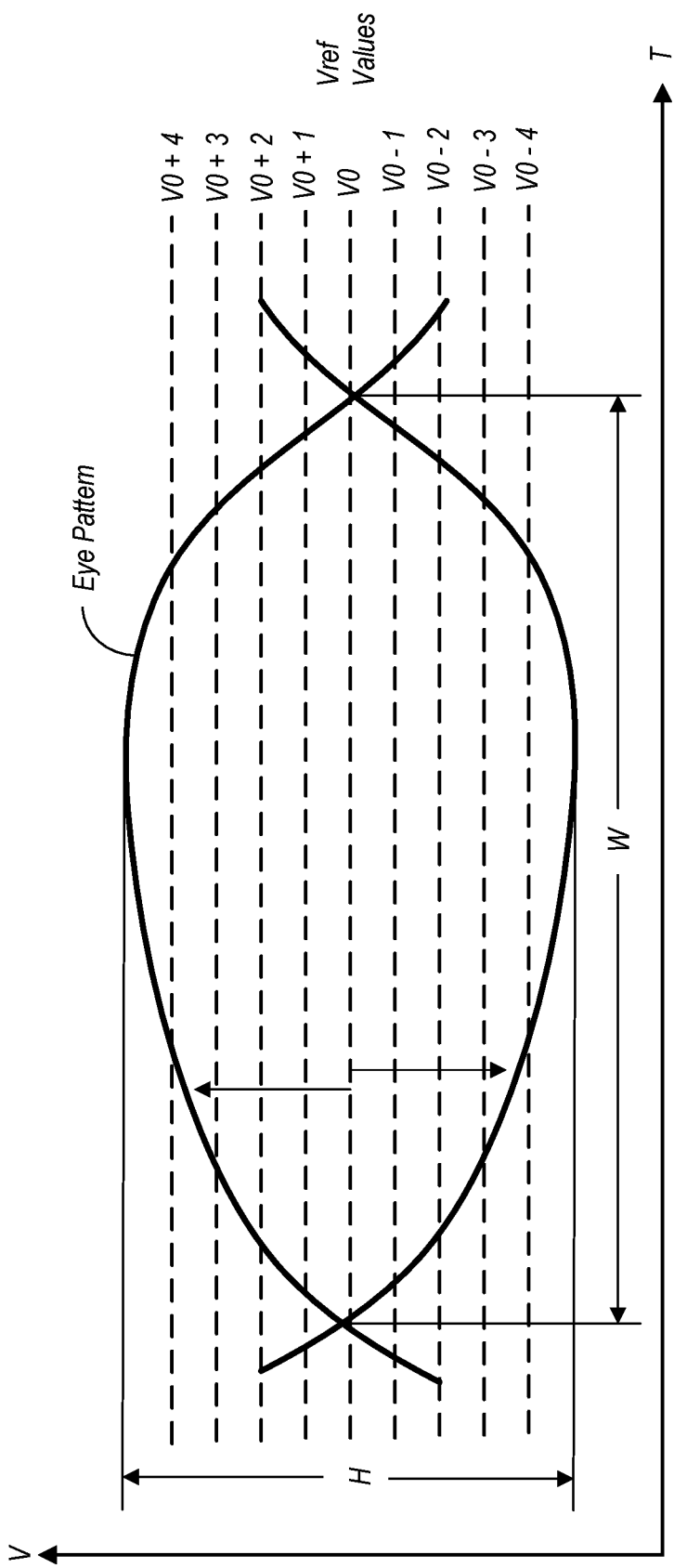
FIG. 5 is an illustration of an eye diagram providing details for a reference voltage calibration performed in one embodiment of a memory subsystem.

Some calibration operations may include a number of writes of data to memory in addition to a number of reads of data from memory. Over a number of iterations, eye calculator 211 may cause adjustments to both the delay used in generation of the data strobe signal (via the Dly_Ctl signal) and the voltage used to distinguish between a logic one and a logic zero. Performing these operations for a number of different delay and reference voltage values may be used to define the eye pattern for the calibrated signal paths. An example eye pattern is shown in FIG. 2, with its height H defined along the vertical, voltage axis V, while the width W is defined along the time axis T (a more detailed example is shown in FIG. 5). The voltage axis represents values of the reference voltage, while the time axis represents delay values applied to the data strobe signal by delay circuit 230. Values within the defined height and width of the eye pattern indicate areas where data bits conveyed in a signal can be correctly interpreted as a logic one or a logic zero. The areas toward the center of the eye pattern generally have a larger amount of timing margin and voltage margin than those located toward the boundaries.

State machine 210 in the embodiment shown is configured to coordinate the calibration operations. Responsive to receiving a calibration signal (Cal) from an external source, state machine 210 may commence calibration operations. The calibration signal may be received from, e.g., a processor, system firmware, or other source. Assertion of the calibration signal may be performed in conjunction with a system startup, at periodic intervals, and in response to changes in a performance state, among other conditions. During calibration operations, state machine 210 may communicate with eye calculator 211, data comparator 218, and transceiver 220. Among the functions that state machine 210 may perform is issuing commands to transmit data for write operations, to cause memory controller 102 to read data from memory, and to cause a change to the delay and read voltage values. State machine 210 may also determine when a calibration may be terminated early (e.g., during the dynamic reference voltage calibration) or skipped altogether (e.g., when passing through an intermediate performance state during a transition from an initial performance state to a final performance state). Upon completing a given calibration, eye calculator 211 may store the determined reference voltage and delay values. These values may then be used to set the reference voltage and delay values for normal (e.g., non-calibration) operations.

Figure 3:
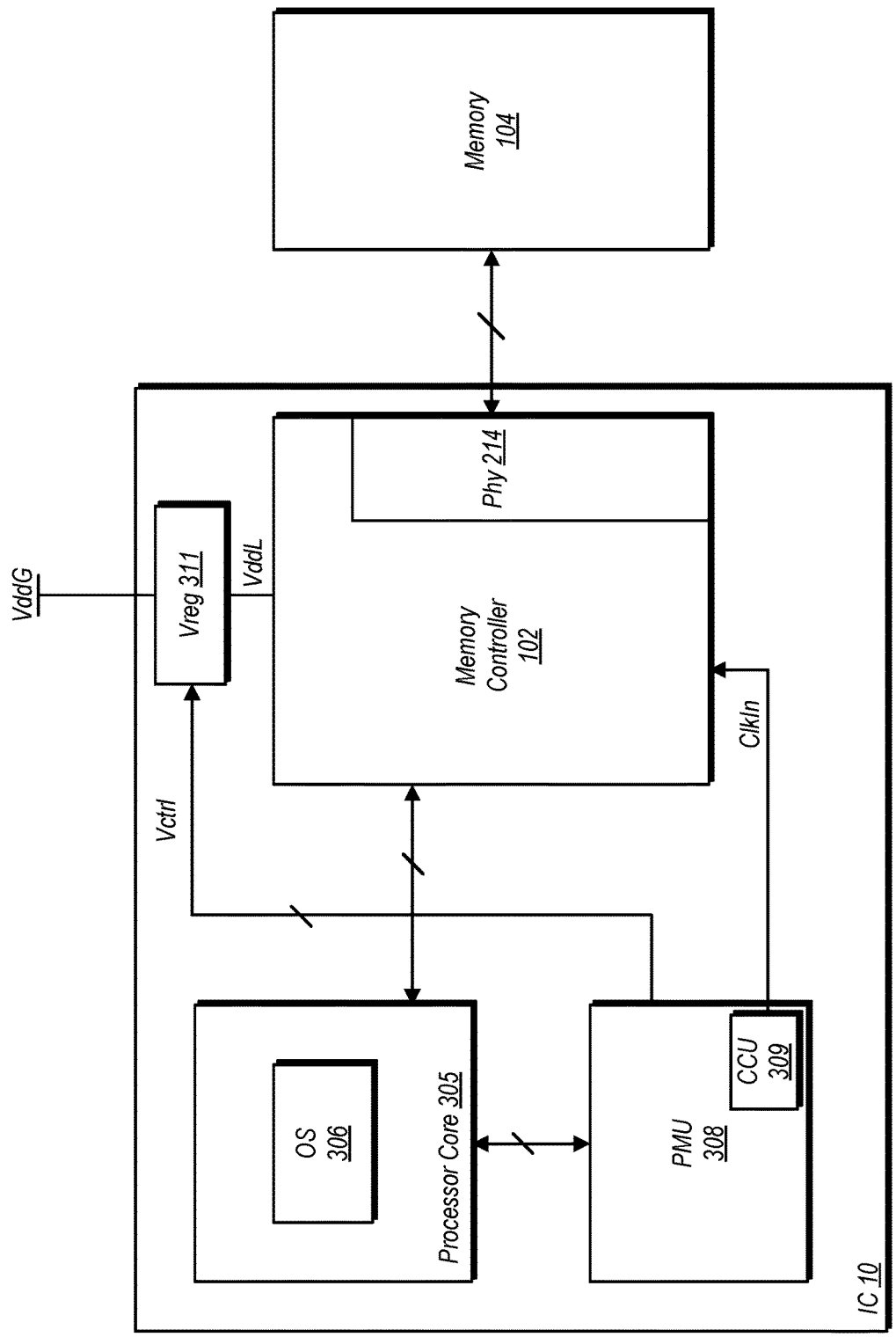
FIG. 3 is a block diagram of one embodiment of a computer system having a memory subsystem.

FIG. 3 is a block diagram illustrating one embodiment of a system having an integrated circuit and a memory. In the embodiment shown, integrated circuit 10 includes at least one processor core 305, a power management unit 308, a voltage regulator 311, and memory controller 102. Memory controller 102 in the embodiment shown may be arranged similar to that which was discussed above in reference to FIG. 2. Integrated circuit 10, and more particularly, memory controller 102, is coupled to a memory 104.

Processor core 305 may be a singular processor core implemented on integrated circuit 10 in some embodiments, or may be one of a number of different processor cores in other embodiments. In embodiments having multiple processor cores, the cores may be homogenous or heterogenous. Among other functions, processor core 305 may execute instructions of an operating system 306 to perform various system-level functions. Among these functions may be decisions on when memory controller 102 is to carry out a calibration of various signal paths coupled between integrated circuit 10 and memory 104. Processor core 305 may also execute instructions of various software programs/applications. As shown here, processor core 305 is coupled to memory controller 102, and may send data thereto and receive data therefrom in carrying out its various operations.

Power management unit 308 in the embodiment shown includes various circuits used to carry out various power management functions of the system. Among these functions include the implementation of performance state changes with regard to the memory subsystem. These performance state changes may include changes of the frequency of the clock signal, ClkIn, that is provided to memory controller 102. In some embodiments, performance state changes may also include changing the operating voltage provided to memory controller 102 via changes to the supply voltage VddL provided from voltage regulator 311.

Higher performance may be achieved in some embodiments by increasing a clock frequency, and may also include increasing an operating voltage. Similarly, a reduction in power consumption may be achieved by reducing the clock frequency and/or the operating voltage. In the embodiment shown, power management unit 308 is configured to generate voltage control signals, Vctrl, which are provided to a voltage regulator 311. A clock control unit 309 may also be used to control the frequency of the clock signal.

Clock control unit 309 may perform various clock control functions. In some embodiments, clock control unit 309 may include circuitry (e.g., a phase-locked loop) for generating a clock signal. In other embodiments, the clock signal may be provided from an external source. Clock control unit 309 may control the parameters of the clock signal ClkIn. Such parameters include the frequency of the clock signal, and may also include its duty cycle. During performance state changes, clock control unit 309 may increase the clock frequency if transitioning to a higher performance state, and reduce the clock frequency if transitioning to a lower performance state. In some instances, e.g., if the system is idle, clock control unit 309 may perform clock gating to inhibit the clock signal from being provided to memory controller 102.

In the embodiment shown, voltage regulator 311 is coupled to receive a global supply voltage, VddG, from an external source, and provide a local supply voltage, VddL, to memory controller 102. Power management unit 308 may cause the local voltage to increase or decrease depending on states of the voltage control signals. Voltage regulator 311 may be any suitable type of circuit for supplying a regulated supply voltage, such as a switching converter (e.g., buck converter, boost converter) or low-dropout (LDO) voltage regulator.

Figure 4:
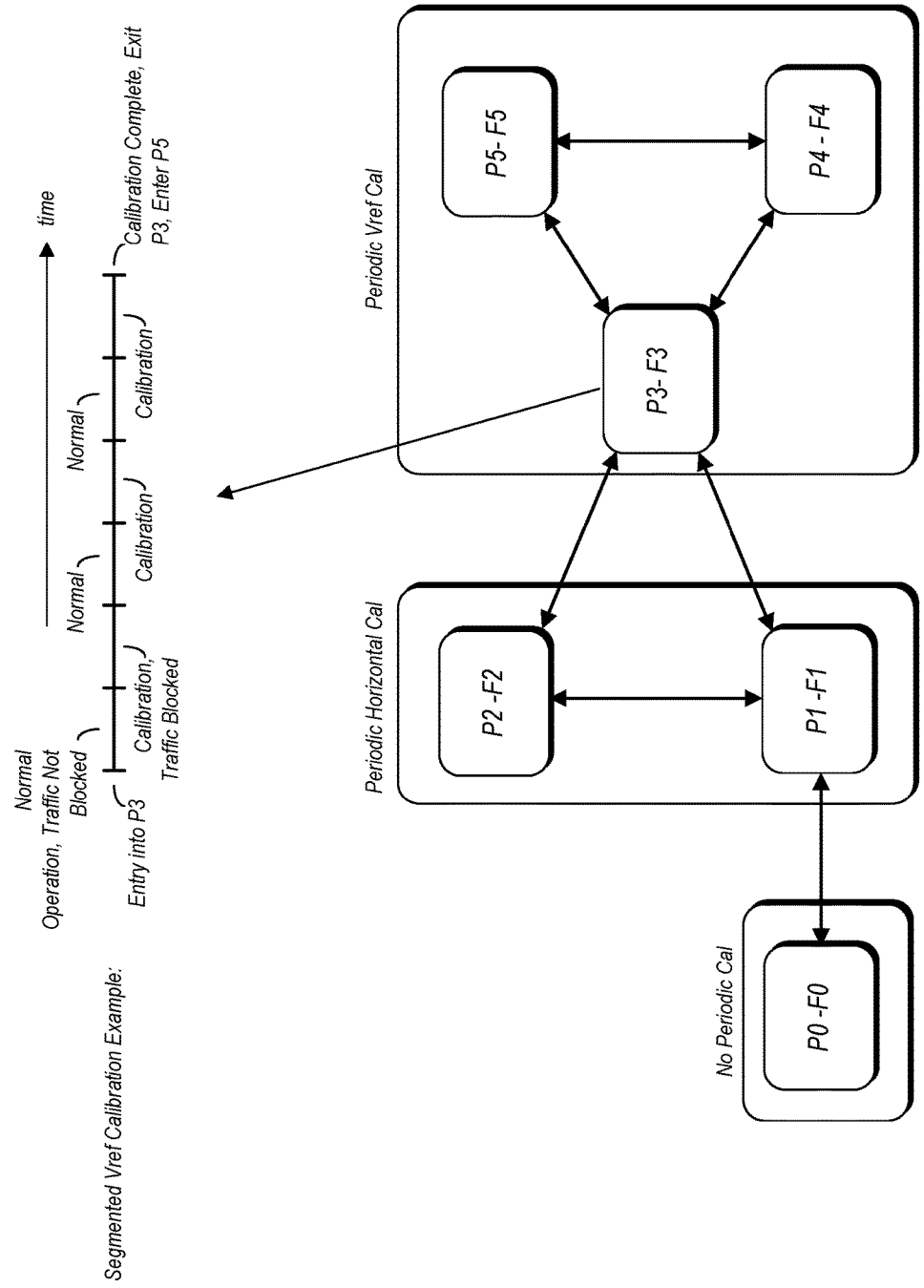
FIG. 4 is a block diagram illustrating possible performance state changes in one embodiment of a memory subsystem.

Performance State Changes:

FIG. 4 is a block diagram illustrating possible performance state changes in one embodiment of a memory subsystem. In the embodiment shown, six different performance states, P0-P5 are shown, each having a respective clock frequency F0-F5. Frequency F0 is the lowest clock frequency in this example, with F5 being the highest and with the clock frequency increasing in order (e.g., F1 is greater than F0, F2 is greater than F1, and so on). Accordingly, P0 is the performance state in this embodiment most focused on power savings and least focused on maximizing performance, while P5 is most focused on maximizing performance at the expense of power savings.

At a startup or reboot of the system operating in accordance with FIG. 4, initial reference voltage calibrations to determine an eye for each of the performance states may be performed. Thereafter, the calibration requirements may vary. For performance state P0, no periodic calibrations are performed, although a calibration may in some cases be performed when entering the state. For performance states P1 and P2, periodic horizontal calibrations are performed at a previously determined reference voltage. For performance state P3, P4, and P5, periodic vertical (reference voltage) calibrations are performed. Generally speaking, as clock frequency increases, timing margins may decrease. Accordingly, calibrations may be performed more often for the performance states associated with higher clock frequencies than those with lower clock frequencies.

In the embodiment shown, transitions between performance states may in some cases include a transition to an intermediate state before entering the final performance state. For example, to transition from P1 to P5, an intermediate transition to P3 occurs before the final transition to P5. This occurs in both directions in the embodiment shown, e.g., a transition from P4 to P2 includes an intermediate transition into P3. In some embodiments, upon transitioning into a particular performance state, a calibration (e.g., a reference voltage calibration is performed). Generally speaking, direct transitions between two different performance states may be made for those states directly connected by a single line as shown in FIG. 4. If two performance states are not connected by a single line, a transition between the two includes at least one intermediate state.

As also shown in FIG. 3, initial entry into P3 may include beginning normal operations prior to any calibration being performed therein, using a previously calibrated reference voltage value. Thus, in this embodiment, P3 may be considered a "safe" state or one in which there is tolerance of a "stale" reference voltage when the state is used as an intermediate or transitory state. At some point after entry into P3, a segmented calibration may commence, using I/O settings associated with P5. These settings may or may not be the same as those for P3, depending on the embodiment. The segmented calibration may continue, alternating between the periods of normal operation and segments of calibration until all segments have been complete. In response to completing the final segment, the transition to P5 may occur, and operation in that performance state may commence without first performing a reference voltage calibration, using the calibrated reference voltage obtained from the reference voltage calibration.

During the performance of the segmented calibration, periods of normal operation (including an initial period upon entry into the intermediate state) are alternated with segments of calibration. The periods of normal operation and segments of calibration may vary in time, and may depend on latency requirements for transactions according to quality of service (QoS) parameters of the system. Furthermore, the defining characteristic of a given segment of calibration may vary from one embodiment to another. For example, a segment can be defined by a particular reference voltage value, with each segment being distinguished from others by the reference voltage value at which the calibration is conducted. In another embodiment, a segment may be defined by a set duration, irrespective of the reference voltage(s) at which calibration is conducted within that segment. It is further noted that the segmented calibration methodology may be combined with the dynamic reference voltage calibration discussed elsewhere in this disclosure. This may reduce the number of segments at which calibrations may be performed, thereby resulting in a faster transition to P5 (or more generally, to the final performance state).

It is noted that in some embodiments, upon entry into a particular performance state, a horizontal calibration at a single reference voltage value may be performed. However, this is not a requirement for all embodiments, as both scenarios are contemplated within this disclosure.

Eye Diagram Example and Dynamic Reference Voltage Calibration:

FIG. 5 is a diagram of an eye pattern resulting from a calibration in one embodiment of a memory subsystem. FIG. 5 will be used herein to further explain the dynamic reference voltage calibration.

As shown in FIG. 5, the eye comprises a range of voltages and time delays. Voltages are represented by the vertical axis, while time is represented by the horizontal axis. The maximum range of voltages at which data can be validly read is the height of the eye, "H." The maximum range of time delays (as applied to the data strobe signal) is the width of the eye, "W."

In the illustrated example, a number of reference voltage values are shown, e.g., V0, V0+1, V0−1, and so on. These values (which may change from one calibration cycle to the next) represent vertical calibration voltages. Generally speaking, a vertical calibration may start with an initial horizontal calibration at some reference voltage designated as V0. Thereafter, during a full vertical calibration, horizontal calibrations are conducted for number of points upward (e.g., V0+1 through V0+4) followed by horizontal calibrations for a number of points downward (e.g., V0−1 through V0−4). After completing the vertical calibration, reference voltage is selected that has the maximum width W as the calibrated reference voltage value. A next, subsequent calibration may use this calibrated reference voltage value as the initial V0.

As discussed above, the present disclosure contemplates a dynamic reference voltage calibration in which horizontal calibrations are performed at fewer reference voltage values than otherwise would be for a full reference voltage calibration. In a dynamic reference voltage calibration, the first horizontal calibration is performed at the value V0. Upon completing this first horizontal calibration, a determination is made as to whether the width W is the same or greater at V0. If so, the calibration may be terminated at that point, as the greater value of W indicates that timing margins have not degraded at V0 since the last calibration, and may have improved (if W is greater).

If W is less than the previous value as determined from the horizontal calibration at V0, the reference voltage may be adjusted and another horizontal calibration is performed. For example, the reference voltage may be incremented to V0+1, with a horizontal calibration performed at that reference voltage value. Upon completing the horizontal calibration at V0+1, the width W is compared to the width obtained at the horizontal calibration performed at V0. If the width W is less at V0+1 than at V0, no further adjustments are made in that direction, as it is likely that the eye will continue to narrow for subsequent reference voltage increments. If the width W is greater or equal at V0+1 in comparison to V0, another horizontal calibration is performed at the next incremental reference voltage value, V0+2. The width at V0+2 is compared to that at V0+1. If the width at V0+2 is greater than that at V0+1, the reference voltage is incremented again and another horizontal calibration is performed at the next reference voltage value. This may continue until the width narrows at a particular reference voltage (relative to the previous incremental value) or until horizontal calibrations have been conducted at all incremental values.

As previously noted, if the width of the eye has narrowed after incrementing the reference voltage value of V0+1, no further incremental adjustments are made. Instead, the reference voltage may then be adjusted in the opposite direction, e.g., decremented from V0 to V0−1. Thereafter, a horizontal calibration is performed at V0−1, and the width of the eye at that reference voltage is compared to that of V0. The process may be carried out until reaching a reference voltage value at which the width of the eye has decreased, after which the calibration is terminated. Thereafter, the reference voltage at which W was the largest is selected as the new calibrated value.

Generally speaking, the dynamic reference voltage calibration disclosed herein conducts a first horizontal calibration at a starting reference voltage to determine if the timing margins have degraded. If the timing margins have not degraded, the calibration is terminated and the previously calibrated reference voltage value is used. Otherwise, if the timing margins are less at the previous calibrated reference voltage value, the dynamic calibration disclosed herein searches in at least one direction for a reference voltage value at which the eye begins to narrow. As a result of this methodology, the dynamic reference voltage calibration may be reduced to as little as a single horizontal calibration at the previously calibrated reference voltage, and no more than half the number of reference voltage values plus the initial value. Accordingly, the dynamic reference voltage calibration may result in a significant amount of time saved relative to performing a full reference voltage calibration, thereby reducing the amount of time the memory subsystem is unavailable for transactions.

Figure 6:
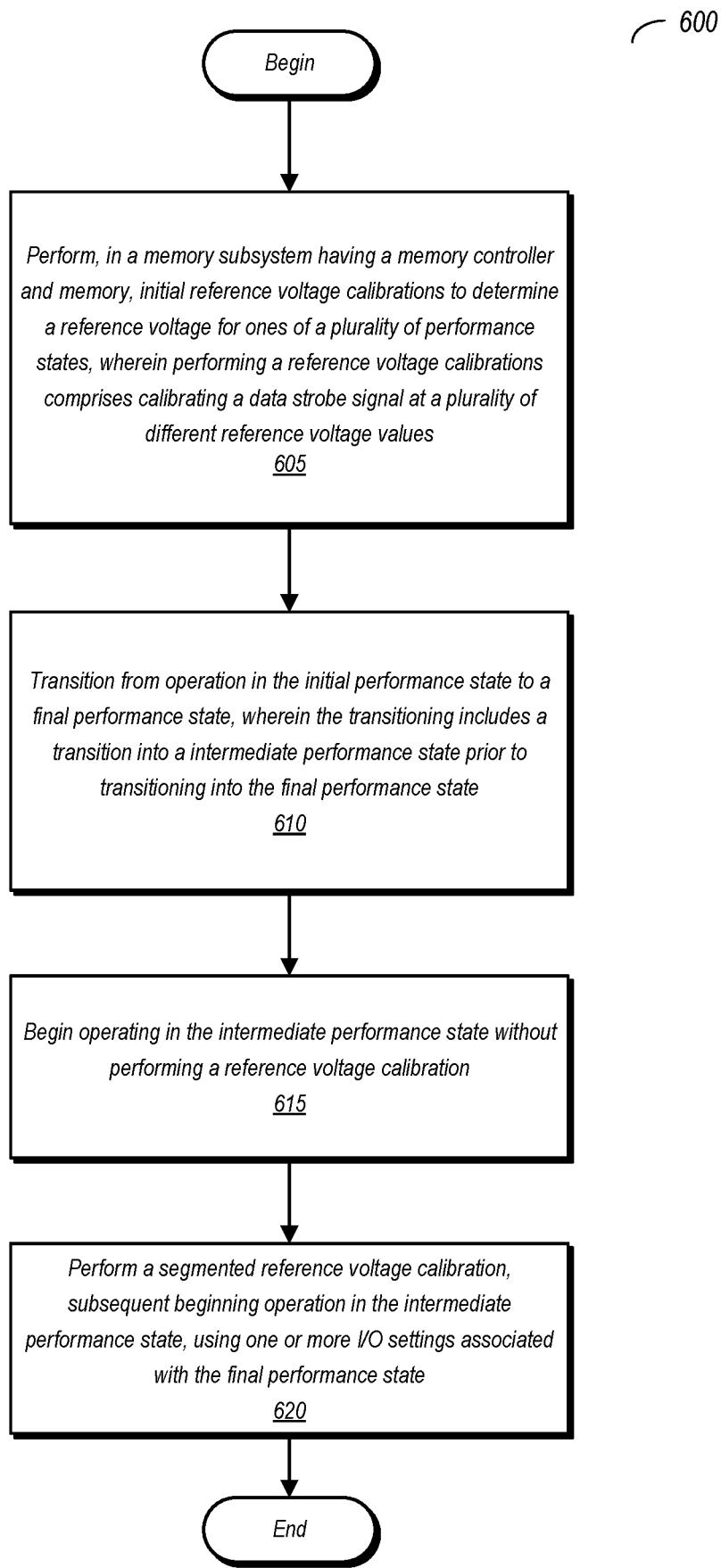
FIG. 6 is a flow diagram illustrating operation of one embodiment of a memory subsystem with regard to performance state changes.

Calibration Methodologies:

FIG. 6 is a flow diagram illustrating operation of one embodiment of a memory subsystem with regard to performance state changes. Method 600 as disclosed herein may be performed in any of the embodiments of a memory subsystem as discussed above. Other embodiments of a memory subsystem capable of carrying out Method 600, but not explicitly disclosed herein, may be considered to fall within the scope of this disclosure.

Method 600 includes performing, in a memory subsystem having a memory controller and a memory, initial reference voltage calibrations to determine a reference voltage for ones of a plurality of performance states, wherein performing initial reference voltage calibrations comprises calibrating a data strobe signal at a plurality of different reference voltage values (block 605). Thereafter, the method includes transitioning from operation in an initial performance state to a final performance state, wherein the transitioning includes a transition into an intermediate performance state prior to transitioning into the final performance state (block 610). The method further includes beginning operating in the intermediate performance state without performing a reference voltage calibration (block 615) and performing a segmented reference voltage calibration, subsequent to beginning operation in the intermediate performance state, using one or more input/output settings of the final performance state (block 620).

In various embodiments, transitioning from the initial performance state to the intermediate performance state comprises changing a clock frequency from a first value to a second value, and wherein transitioning from the second performance state comprises changing the clock frequency from the second value to a third value. Embodiments of the method may also include periodically performing reference voltage calibrations when operating in selected ones of the plurality of performance states.

Performing the segmented reference voltage calibration in various embodiments includes performing calibration segments in which memory traffic is blocked alternating with periods in which memory traffic is not blocked. The method may also include transitioning to the final performance state in response to completing the segmented reference voltage calibration and beginning operations, including processing memory requests from agents external to the memory subsystem, in the final performance state without first performing a reference voltage calibration.

Performing a calibration in various embodiments includes performing writes of data to the memory at a selected reference voltage and at a plurality of different delay values applied to a data strobe signal. After performing the writes, the method includes performing reads of data from the memory at the selected reference voltage and the ones of the plurality of different delay values and comparing data written to the memory to data read from the memory. The method further includes determining a width of an eye pattern at the selected reference voltage based on the plurality of different delay values and of the data written to the memory and comparisons of the data written to the memory to the data read from the memory.

In some embodiments, a dynamic reference voltage calibration may be performed. In such embodiments, the method includes performing a current calibration at a first value of the reference voltage, wherein the first value of the reference voltage is a reference voltage determined from a most recent prior calibration, and terminating the current calibration in response to determining that a width of an eye pattern at the first value is greater than or equal to the width of the eye pattern determined during the most recent prior calibration.

Embodiments of the method that includes performing a dynamic reference voltage calibration further include adjusting the reference voltage, in a first direction from the first value to a second value in response to determining that the width of the eye pattern at the first reference voltage is less than the width of the eye pattern determined during the most recent prior calibration and continuing the current calibration at the second value. Performing additional adjustments of the reference voltage in the first direction is discontinued in response to determining that the width of an eye pattern at the second value is less than or equal to the width of the eye pattern at the first value.

If the width of an eye pattern at the second value is less than or equal to the width of the eye pattern at the first value, the method continues by adjusting the reference voltage, in a second direction from the first value, to a third value and continuing the current calibration at the third value. The method further includes discontinuing performing additional adjustments of the reference voltage in the second direction in response to determining that the width of the eye pattern at the third value is less than the width of the eye pattern at the first value.

Figure 7:
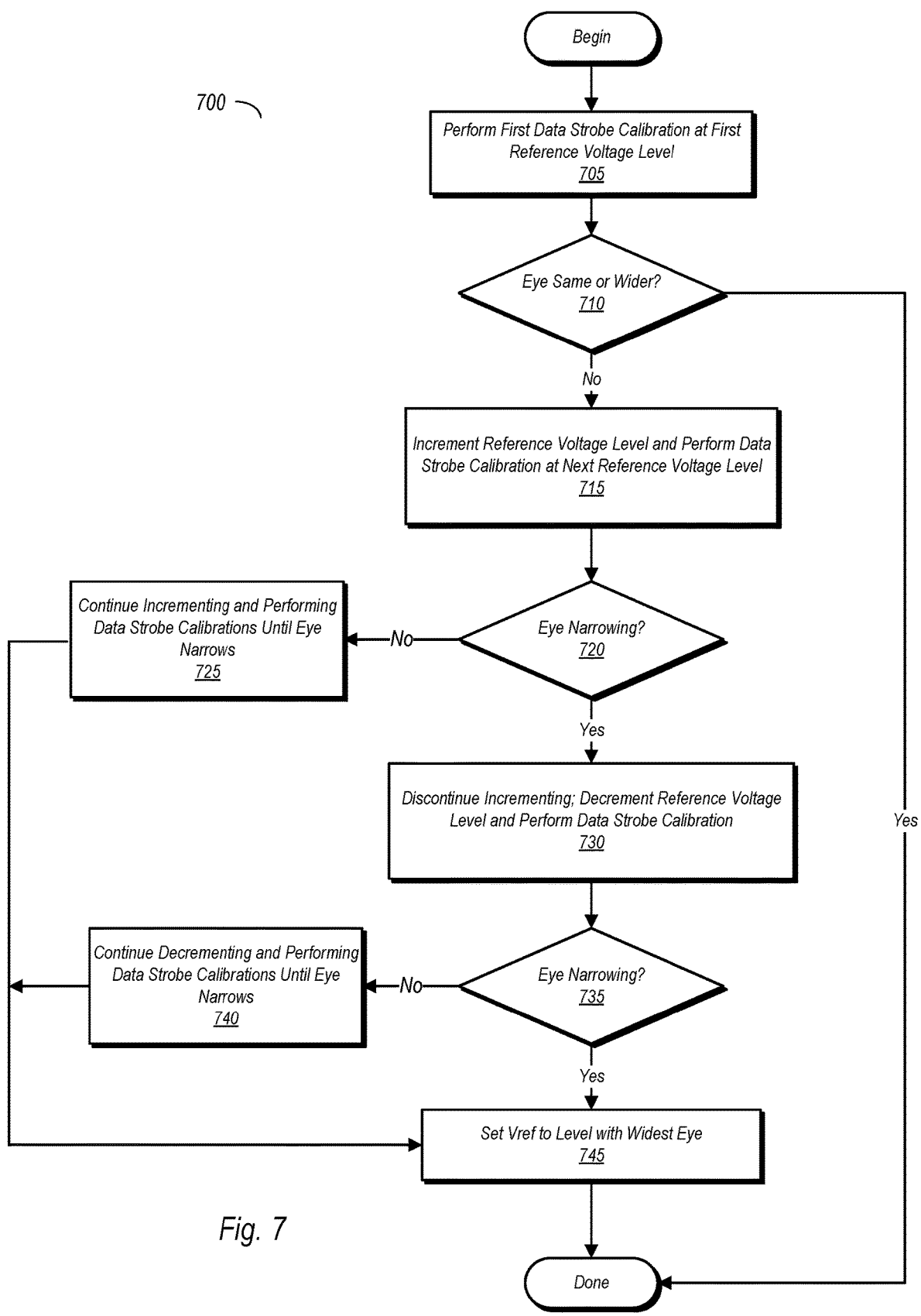
FIG. 7 is a flow diagram illustrating one embodiment of a method for performing a dynamic reference voltage calibration.

FIG. 7 is a flow diagram illustrating one embodiment of a method for performing a dynamic reference voltage calibration. Method 700 may be performed using any of the apparatus embodiments discussed above. Apparatus embodiments capable of carrying out method 700, but not otherwise disclosed herein are also considered to fall within the scope of this disclosure. It is noted that while Method 600 discussed above and Method 700 can be performed independently of one another, the disclosure also contemplates that these two methods may be used together.

Method 700 includes performing a first data strobe calibration at a first reference voltage value (block 705). The data strobe calibration may be alternately referred to as a horizontal calibration, and may be performed by applying various amounts of delay to a data strobe signal during reads of data from memory and comparing the read data with expected data. In various embodiments, the first reference voltage value may be a reference voltage determined during a previous calibration. If, at the first reference voltage value, the eye is determined to be the same width or wider (block 710, yes), then the calibration is terminated at that point, and the first reference voltage value is used as the calibrated value.

If the eye is not the same width or wider at the first reference voltage (block 710, no), the reference voltage is incremented and a data strobe calibration is performed at the next reference voltage value (block 715). If, at the next reference voltage value, the eye is determined to not be narrowing relative to the width of the eye at the first reference voltage value (block 720, no), additional incrementing is performed, with data strobe calibrations at each incremental reference voltage, until the eye narrows (block 725). Thereafter, the reference voltage value is set to the level at which the eye is the widest (block 745).

If the eye is determined to be narrowing after the first incrementing of the reference voltage value (block 720, yes), incrementing is discontinued, the reference voltage is decremented from the first value and another data strobe calibration is performed (block 730). If the eye is not determined to be narrowing at the new reference voltage value (block 735), the method continues with one or more additional decrements of the reference voltage, with corresponding data strobe calibrations, until it is determined that the eye is narrowing (block 740). Thereafter, the decremented reference voltage having the widest eye is selected as the calibrated value. If, after the first decrement of the reference voltage, the eye is determined to be narrowing (block 735, yes), the method proceeds to block 745, with the reference voltage having the widest eye being the previously calibrated value.

It is noted that while the terms "incrementing" and "decrementing" are used in the discussion above, these terms are not meant to be limiting, and may be replaced by "adjusting in a first direction" and "adjusting in a second direction," wherein the first and second directions are opposite one another.

Figure 8:
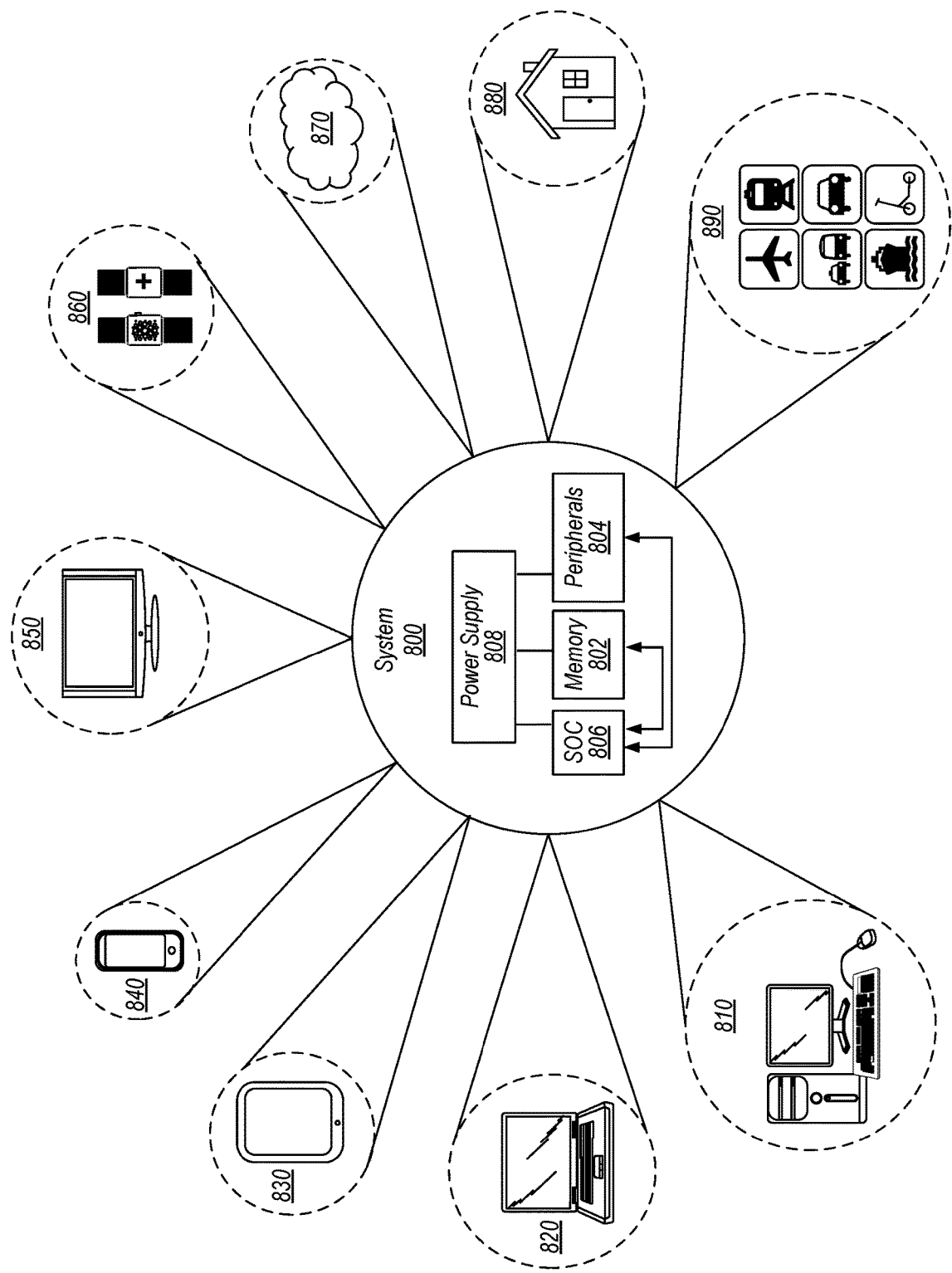
FIG. 8 is a block diagram of one embodiment of an example system.

Example System:

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

In various embodiments of system 800, one or more instances of a memory subsystem as discussed above may be implemented. Such a memory subsystem may operate in a number of different performance states, and calibrations may thus be conducted in the manner previously described.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112 (f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
a memory; and
a memory controller coupled to the memory, wherein the memory controller is configured to operate in a plurality of performance states that includes initial, final, and intermediate performance states and wherein the memory controller includes a calibration circuit configured to perform initial reference voltage calibrations to determine a corresponding reference voltage for ones of the plurality of performance states;
wherein the memory controller is configured to transition from the initial performance state to the final performance state via the intermediate performance state without causing the calibration circuit to perform a reference voltage calibration prior to beginning operation in the intermediate performance state, and further configured to cause performing of a segmented reference voltage calibration, subsequent to beginning operation in the intermediate performance state, using one or more input/output settings of the final performance state.

2. The apparatus of claim 1, wherein during a given reference voltage calibration, the calibration circuit is configured to:
perform a first calibration at a first reference voltage value;
increment the reference voltage to a second reference voltage value greater than the first reference voltage value;
perform a second calibration at the second reference voltage value; and
discontinue incrementing the reference voltage and inhibit performing additional calibrations at reference voltage values greater than the first reference voltage in response to determining that a width of an eye pattern at which valid data is read during the second calibration is less than or equal to a width of the eye pattern at which valid data is read during the first calibration.

3. The apparatus of claim 2, wherein the calibration circuit is further configured to:
decrement the reference voltage to a third reference voltage value less than the first reference voltage value;
perform a third calibration at the third reference voltage value; and
discontinue decrementing and inhibit performing additional calibrations at reference voltage values less than the first reference voltage in response to determining that a width of the eye pattern at which valid data is read during the third calibration is less than or equal to a width of the eye pattern at which valid data is read during the first calibration.

4. The apparatus of claim 2, wherein the first reference voltage value is a most recent previously calibrated reference voltage value.

5. The apparatus of claim 1, wherein ones of the plurality of performance states are defined by a clock frequency.

6. The apparatus of claim 1, wherein ones of the plurality of performance states are defined by a supply voltage at which the memory and the memory controller operate.

7. The apparatus of claim 1, wherein performing the segmented reference voltage calibration comprises performing calibration segments in which memory traffic is blocked alternating with periods in which memory traffic is not blocked.

8. The apparatus of claim 7, wherein the memory controller is configured to transition to the final performance state in response to the calibration circuit completing the segmented reference voltage calibration, and is further configured to begin performing data transfers with the memory without first performing a reference voltage calibration in the final performance state.

9. The apparatus of claim 1, wherein the calibration circuit is configured to perform periodic reference voltage calibrations when operating in ones of the plurality of performance states.

10. A method comprising:
performing, in a memory subsystem having a memory controller and a memory, initial reference voltage calibrations to determine a reference voltage for ones of a plurality of performance states, wherein performing initial reference voltage calibrations comprises calibrating a data strobe signal at a plurality of different reference voltage values;

transitioning from operation in an initial performance state to a final performance state, wherein the transitioning includes a transition into an intermediate performance state prior to transitioning into the final performance state;

beginning operating in the intermediate performance state without performing a reference voltage calibration; and performing a segmented reference voltage calibration, subsequent to beginning operation in the intermediate performance state, using one or more input/output settings of the final performance state.

11. The method of claim 10, wherein transitioning from the initial performance state to the intermediate performance state comprises changing a clock frequency from a first value to a second value, and wherein transitioning from the intermediate performance state comprises changing the clock frequency from the second value to a third value.

12. The method of claim 10, wherein performing the segmented reference voltage calibration comprises performing calibration segments in which memory traffic is blocked alternating with periods in which memory traffic is not blocked, and wherein the method further comprises:

transitioning to the final performance state in response to completing the segmented reference voltage calibration; and beginning operations, including processing memory requests from agents external to the memory subsystem, in the final performance state without first performing a reference voltage calibration.

13. The method of claim 10, further comprising:
performing a current calibration at a first value of the reference voltage, wherein the first value of the reference voltage is a reference voltage determined from a most recent prior calibration; and
terminating the current calibration in response to determining that a width of an eye pattern at the first value is greater than or equal to the width of the eye pattern determined during the most recent prior calibration.

14. The method of claim 13, further comprising:
adjusting the reference voltage, in a first direction from the first value to a second value, in response to determining that the width of the eye pattern at the first reference voltage is less than the width of the eye pattern determined during the most recent prior calibration;
continuing the current calibration at the second value; and
discontinuing performing additional adjustments of the reference voltage in the first direction in response to determining that the width of an eye pattern at the second value is less than or equal to the width of the eye pattern at the first value.

15. The method of claim 14, further comprising:
adjusting the reference voltage, in a second direction from the first value, to a third value;
continuing the current calibration at the third value; and
discontinuing performing additional adjustments of the reference voltage in the second direction in response to determining that the width of the eye pattern at the third value is less than the width of the eye pattern at the first value.

16. The method of claim 10, wherein performing a reference voltage calibration comprises:

performing writes of data to the memory at a selected reference voltage and at a plurality of different delay values applied to a data strobe signal;

performing reads of data from the memory at the selected reference voltage and the ones of the plurality of different delay values;

compare data written to the memory to data read from the memory; and determining a width of an eye pattern at the selected reference voltage based on the plurality of different delay values and comparisons of the data written to the memory to the data read from the memory.

17. A system comprising:
a memory subsystem having a memory and a memory controller coupled to the memory, wherein the memory controller includes a calibration control circuit configured to perform initial reference voltage calibrations to determine corresponding values of a reference voltage for ones of a plurality of performance states, wherein different ones of the performance states are defined by corresponding ones of a plurality of clock frequencies at which the memory controller operates;

wherein, during a transition from an initial performance state to a final performance state via an intermediate performance state, the memory controller is configured to begin operation in the intermediate state and subsequently cause the calibration control circuit perform a segmented reference voltage calibration using input/output settings of the final performance state, wherein performing the segmented reference voltage calibration comprises performing a reference voltage calibration in portions in which memory traffic is blocked alternating with periods where the memory traffic is not blocked, and wherein the memory controller is configured to transition to the final performance state in response to completing the segmented reference voltage calibration.

18. The system of claim 17, wherein the calibration control circuit is configured to determine, in ones of the plurality of performance states, initial eye patterns indicating ranges of values at which valid data can be read from the memory, wherein determining an eye pattern comprises performing data strobe calibrations at a plurality of reference voltages.

19. The system of claim 17, wherein the calibration control circuit is further configured to:
perform a current calibration at a first value of the reference voltage, wherein the first value of the reference voltage is a reference voltage determined from a most recent prior calibration; and
terminating a current calibration in response to determining that a width of an eye pattern at the first value is greater than or equal to the width of the eye pattern determined during the most recent prior calibration.

20. The system of claim 19, wherein the calibration control circuit is further configured to:
adjust the reference voltage, in a first direction from the first value to a second value in response to determining that the width of the eye pattern at the first reference voltage is less than the width of the eye pattern determined during the most recent prior calibration;
continue the current calibration at the second value;
discontinue performing additional adjustments of the reference voltage in the first direction in response to determining that the width of an eye pattern at the second value is less than or equal to the width of the eye pattern at the first value;

adjust the reference voltage, in a second direction from the first value, to a third value;

continue the current calibration at the third value; and discontinue performing additional adjustments of the reference voltage in the second direction in response to determining that the width of the eye pattern at the third value is less than the width of the eye pattern at the first value.

* * * * *